US010506719B2

(12) United States Patent
Holman, IV et al.

(10) Patent No.: US 10,506,719 B2
(45) Date of Patent: Dec. 10, 2019

(54) THERMAL DISSIPATER APPARATUS FOR USE WITH ELECTRONIC DEVICES

(71) Applicant: BlackBerry Limited, Waterloo (CA)

(72) Inventors: Martin Earl Holman, IV, West Palm Beach, FL (US); Patrick Yves Mas, Sunrise, FL (US); Rohit Koppal, Redmond, WA (US)

(73) Assignee: BlackBerry Limited, Waterloo, Ontario (CA)

( * ) Notice: Subject to any disclaimer, the term of this patent is extended or adjusted under 35 U.S.C. 154(b) by 866 days.

(21) Appl. No.: 13/742,013

(22) Filed: Jan. 15, 2013

(65) Prior Publication Data

US 2014/0196878 A1     Jul. 17, 2014

(51) Int. Cl.
*H05K 3/00*          (2006.01)
*H01L 23/36*        (2006.01)
*H01L 23/42*        (2006.01)
*F28F 3/02*         (2006.01)

(52) U.S. Cl.
CPC ......... *H05K 3/0061* (2013.01); *H01L 23/36* (2013.01); *H01L 23/42* (2013.01); *F28F 3/02* (2013.01); *H01L 2924/0002* (2013.01); *Y10T 29/4935* (2015.01)

(58) Field of Classification Search
CPC ...... F28D 2021/0028; F28D 2021/0029; F28F 2013/006; F28F 3/00; F28F 3/02; F28F 2013/005; H01L 23/367; H01L 23/3675; H01L 23/36; H01L 23/42; H01L 2924/0002; H01L 2023/4037; H01L 2023/4056; H01L 2023/4068; H05K 3/0061

USPC ............... 257/712, 713, 722; 361/709, 710; 438/122; 165/185
See application file for complete search history.

(56) References Cited

U.S. PATENT DOCUMENTS

| | | | |
|---|---|---|---|
| 5,057,909 A | 10/1991 | Mok et al. | |
| 5,648,890 A | 7/1997 | Loo et al. | |
| 5,653,285 A * | 8/1997 | Lee ........................... | F28F 3/02 165/185 |
| 5,891,755 A | 4/1999 | Edwards et al. | |
| 6,016,006 A | 1/2000 | Kolman et al. | |
| 6,392,890 B1 | 5/2002 | Katchmar | |
| 6,656,770 B2 * | 12/2003 | Atwood et al. ............... | 438/118 |

(Continued)

FOREIGN PATENT DOCUMENTS

CN           101988335        3/2011

OTHER PUBLICATIONS

Extended European Search Report issued in connection with European Application No. 13151350.9, dated Jun. 5, 2013 (9 pages).

(Continued)

*Primary Examiner* — Jason Thompson
*Assistant Examiner* — Raheena R Malik
(74) *Attorney, Agent, or Firm* — Fish & Richardson P.C.

(57) ABSTRACT

Thermal dissipater apparatus for use with electronic devices. An example heat dissipater apparatus disclosed herein includes a body defining a lateral wall. A first wall projects from an inner surface of the lateral wall to define a first cavity, and a second wall projects from the inner surface of the lateral wall to define a second cavity. The first wall isolates the first cavity from the second cavity.

13 Claims, 10 Drawing Sheets

(56) References Cited

U.S. PATENT DOCUMENTS

| | | | |
|---|---|---|---|
| 7,650,931 B2* | 1/2010 | Siu | F28D 15/0233 165/104.26 |
| 7,671,120 B2* | 3/2010 | Matayabas, Jr. | H01L 23/3737 524/261 |
| 8,520,388 B2* | 8/2013 | Kurosawa | 361/700 |
| 2002/0195231 A1* | 12/2002 | Siu | B21D 53/04 165/104.33 |
| 2006/0260785 A1* | 11/2006 | Hsia | H01L 23/467 165/80.3 |
| 2008/0237841 A1* | 10/2008 | Arana et al. | 257/712 |
| 2010/0059880 A1* | 3/2010 | Baek | H01L 23/467 257/713 |
| 2010/0128438 A1* | 5/2010 | Huang | H01L 23/36 361/704 |
| 2010/0271781 A1 | 10/2010 | Busch et al. | |
| 2012/0168122 A1 | 7/2012 | Skepnek et al. | |
| 2013/0087905 A1* | 4/2013 | Yamada | C09D 183/04 257/712 |

OTHER PUBLICATIONS

Communication Pursuant to Article 94(3) EPC issued in European Application No. 13151350.9 dated Sep. 15, 2017; 4 pages.

* cited by examiner

THERMAL DISSIPATER APPARATUS FOR USE WITH ELECTRONIC DEVICES

FIELD OF DISCLOSURE

The present disclosure relates to electronic devices, including but not limited to, thermal dissipater apparatus for use with electronic devices.

BACKGROUND

Electronic devices, including portable electronic devices, have gained widespread use and may provide a variety of functions including, for example, telephonic, electronic messaging and other personal information manager (PIM) application functions, digital cameras and the like. Portable electronic devices include, for example, several types of mobile stations such as simple cellular telephones, smart phones, wireless personal digital assistants (PDAs), and laptop computers with wireless 802.11 or Bluetooth capabilities.

Portable electronic devices such as PDAs or smart telephones are generally intended for handheld use and ease of portability. Smaller devices are generally desirable for portability. With continued demand for decreased size of portable electronic devices, electronic devices continue to decrease in size. Decreasing the size of the electronic device typically requires relatively smaller electronic components such as, for example, smaller integrated circuits and/or microprocessors and/or surface mounting the electronic components to a printed circuit board to reduce a dimensional thickness or profile of the electronic device.

However, decreasing the dimensional size of the electronic components and/or surface mounting the electronic components may require more efficient and/or accelerated dissipation of the heat generated by the electronic components. Failing to efficiently dissipate heat from the electronic components may cause a temperature of a housing of the electronic device to increase to a temperature that may be discomforting to a user holding the electronic device. Additionally or alternatively, failing to efficiently dissipate heat generated by the electronic components may cause the operating temperatures of the electronic components to be greater than a maximum allowable operating temperature.

DETAILED DESCRIPTION

Figure 1:
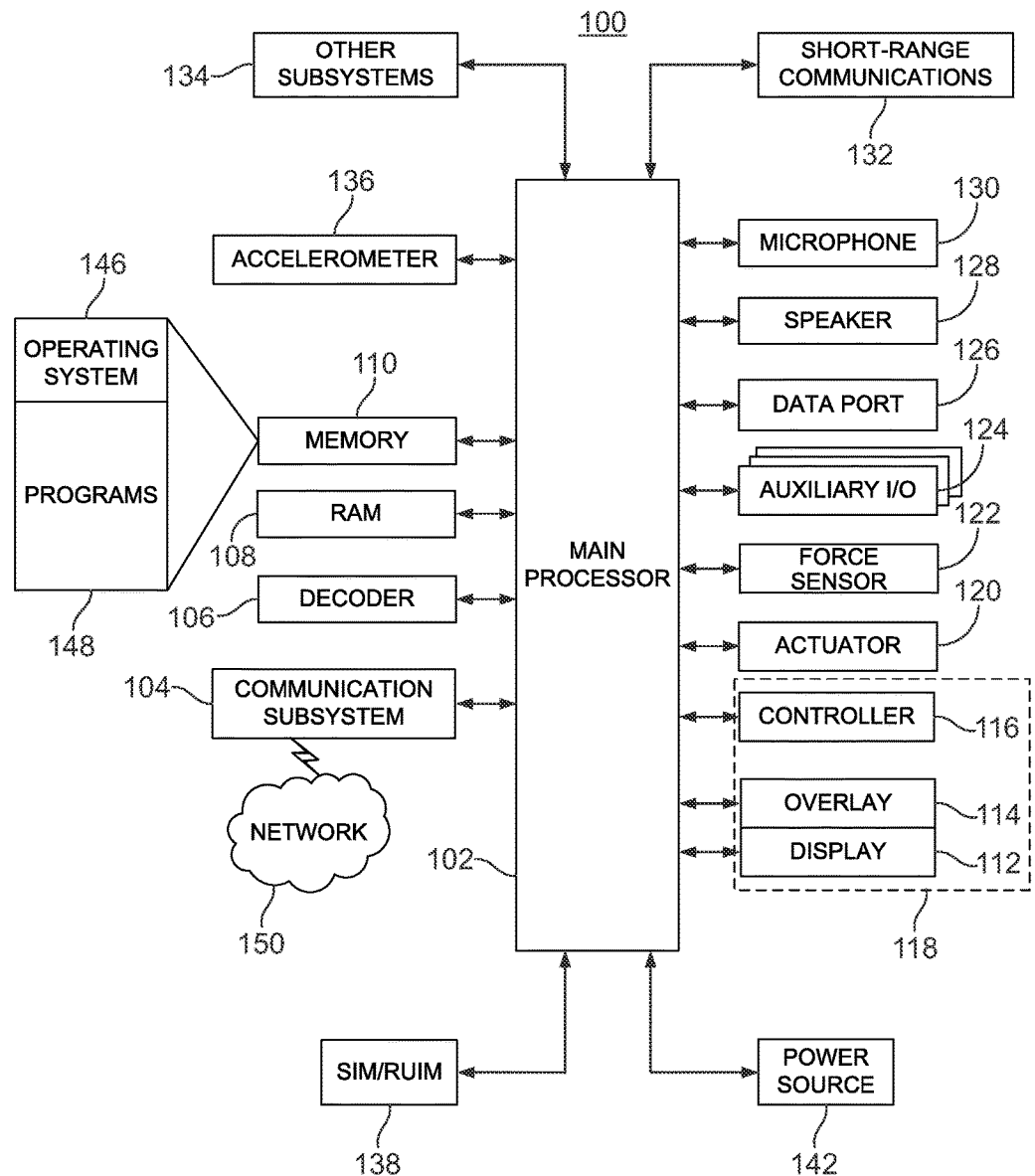
FIG. 1 is a block diagram of an example portable electronic device in accordance with the teachings of this disclosure.

Known electronic devices employ heat shields or heat dissipation apparatus (e.g., a heat sink) to dissipate or transfer heat generated by electronic components of an electronic device. For example, known heat shields or heat sink are often employed to dissipate heat from an integrated circuit of a printed circuit board to help maintain an operating temperature of the integrated circuit below a maximum allowable operating temperature. To increase heat dissipation efficiency or effectiveness, a thermal gel or grease is often applied to known heat shields. To prevent the thermal grease from contacting discrete components surrounding the integrated circuit, the thermal gel or grease is typically provided on approximately 65% of an upper or top surface of the integrated circuit chip and/or the heat shield. Thus, because the thermal gel is applied only to approximately 65% of a surface area of the electronic component, a heat transfer rate and/or efficiency is significantly reduced. As a result, a temperature of an electronic component may rise to a temperature that approaches and/or exceeds a maximum operating temperature rating.

Example thermal dissipation assemblies disclosed herein significantly maintain external surfaces of an electronic device below acceptable temperature levels and maintain operating temperatures of internal electronic components significantly below their maximum rated operating temperatures while the components operate at maximum power. More specifically, the example thermal dissipation assemblies disclosed herein employ a thermal dissipater shield apparatus that significantly increases heat transfer and/or heat dissipation efficiency compared to, for example, known heat shields or heat sinks. In particular, the example shield apparatus disclosed herein significantly increase a surface area to dissipate and/or spread heat generated by electronic components of a printed circuit board. For example, the example shield apparatus disclosed herein effectively and rapidly remove heat from a surface mounted integrated circuit (IC) and transfer the heat to cooler surroundings. As a result, the example shield apparatus disclosed herein significantly accelerate cooling of the electronic devices to maintain the electronic devices at temperatures substantially less than maximum operating temperatures.

Additionally or alternatively, the example shield apparatus disclosed herein enable application of a thermal gel or grease to a substantially greater (e.g., an entire) surface area of an electronic component positioned on a circuit board of the electronic device. In particular, the example shield apparatus disclosed herein provide a cavity to receive an electronic component. More specifically, the walls defining the cavity surround and/or isolate an electronic component from neighboring discrete electronic components to enable a thermal gel to be applied to all surfaces of the isolated electronic component in communication with the cavity. For example, thermal gel may be applied to cover 100% of a surface area (e.g., a top surface) of an integrated circuit (e.g., IC) and all side surfaces (e.g., four sides) of an integrated circuit. As a result, a heat transfer rate and/or thermal dissipation efficiency is significantly increased. In other words, heat dissipation and/or cooling of the electronic components is accelerated by enabling a thermal gel to be applied to a greater amount of surface area of the electronic component without affecting discrete components surrounding the electronic component.

Additionally or alternatively, the example shield apparatus disclosed herein increase an amount of time needed to reach temperature equilibrium between the integrated circuit and the shield apparatus. In this manner, by increasing a time needed to reach equilibrium, the integrated circuit can be run at an upper limit or maximum power rating before a voltage to the integrated circuit is reduced (e.g., chocked). Therefore, the example shield apparatus disclosed herein enable an integrated circuit to run at maximum power for a greater duration of time than, for example, known shield apparatus.

In some examples, the example shield apparatus disclosed herein employ an oversized surface or canopy that can project or over hang across at least some portions of neighboring electronic components and/or heat shields positioned adjacent the electronic component positioned in the first cavity. Additionally, the thermal gel can be applied to the oversized surface or canopy to further increase heat dissipation and/or a heat transfer rate to accelerate or more rapidly cool the electronic components covered by the oversized surface or canopy. In some examples, a thermal spreader may be positioned on the canopy of the shield apparatus to further increase heat dissipation and/or heat transfer rate. Further, the example shield apparatus may be composed of copper, aluminum, magnesium and/or other metallic material to provide EMI/RF shielding.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

The disclosure generally relates to an electronic device, such as a portable electronic device, non-portable electronic device and/or any other device (e.g., non-electronic device) having a housing that includes an access opening. Examples of portable electronic devices include mobile, or handheld, wireless communication devices such as pagers, cellular phones, cellular smart-phones, wireless organizers, personal digital assistants, wirelessly enabled notebook computers, tablet computers, mobile internet devices, electronic navigation devices, and so forth. The portable electronic device may be a portable electronic device without wireless communication capabilities, such as handheld electronic games, digital photograph albums, digital cameras, media players, e-book readers, and/or any other device(s) that includes a housing having an access opening. Examples of non-portable electronic devices include desktop computers, electronic white boards, smart boards utilized for collaboration, built-in monitors or displays in furniture or appliances, and/or any other device having a housing that includes an access opening.

A block diagram of an example portable electronic device 100 is shown in FIG. 1. The portable electronic device 100 includes multiple components, such as a processor 102 that controls the overall operation of the portable electronic device 100. Communication functions, including data and voice communications, are performed through a communication subsystem 104. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the portable electronic device 100.

The processor 102 interacts with other components, such as a Random Access Memory (RAM) 108, memory 110, a touch-sensitive display 118, one or more actuators 120, one or more force sensors 122, an auxiliary input/output I/O subsystem 124, a data port 126, a speaker 128, a microphone 130, short-range communications 132 and other device subsystems 134, etc. The processor 102 may also interact with an accelerometer 136 that may be utilized to detect direction of gravitational forces or gravity-induced reaction forces.

The touch-sensitive display 118 includes a display 112 and touch sensors 114 that are coupled to at least one controller 116 that is utilized to interact with the processor 102. Input via a graphical user interface is provided via the touch-sensitive display 118. Information, such as text, characters, symbols, images, icons, and other items that may be displayed or rendered on a portable electronic device, is displayed on the touch-sensitive display 118 via the processor 102.

The touch-sensitive display 118 may be any suitable touch-sensitive display, such as a capacitive, resistive, infrared, surface acoustic wave (SAW) touch-sensitive display, strain gauge, optical imaging, dispersive signal technology, acoustic pulse recognition, and so forth. A capacitive touch-sensitive display includes one or more capacitive touch sensors 114. The capacitive touch sensors may comprise any suitable material, such as indium in oxide (ITO).

To identify a subscriber for network access, the portable electronic device 100 may utilize a Subscriber Identity Module or a Removable User Identity Module (SIM/RUIM) card 138 for communication with a network, such as the wireless network 150. Alternatively, user identification information may be programmed into memory 110.

The portable electronic device 100 includes an operating system 146 and software programs, applications, or components 148 that are executed by the processor 102 and are typically stored in a persistent, updatable store such as the memory 110. Additional applications or programs may be loaded onto the portable electronic device 100 through the wireless network 150, the auxiliary I/O subsystem 124, the data port 126, the short-range communications subsystem 132, or any other suitable subsystem 134.

A received signal such as a text message, an e-mail message, or web page download is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104. For voice communications, the overall operation of the portable electronic device 100 is similar. The speaker 128 outputs audible information converted from electrical signals, and the microphone 130 converts audible information into electrical signals for processing.

The methods described herein may be carried out by software executed, for example, by the processor 102. Coding of software for carrying out such a method is within the scope of a person of ordinary skill in the art given the present description. A computer-readable medium having computer-readable code may be executed by at least one processor of the portable electronic device 100 to perform the methods described herein.

Figure 2:
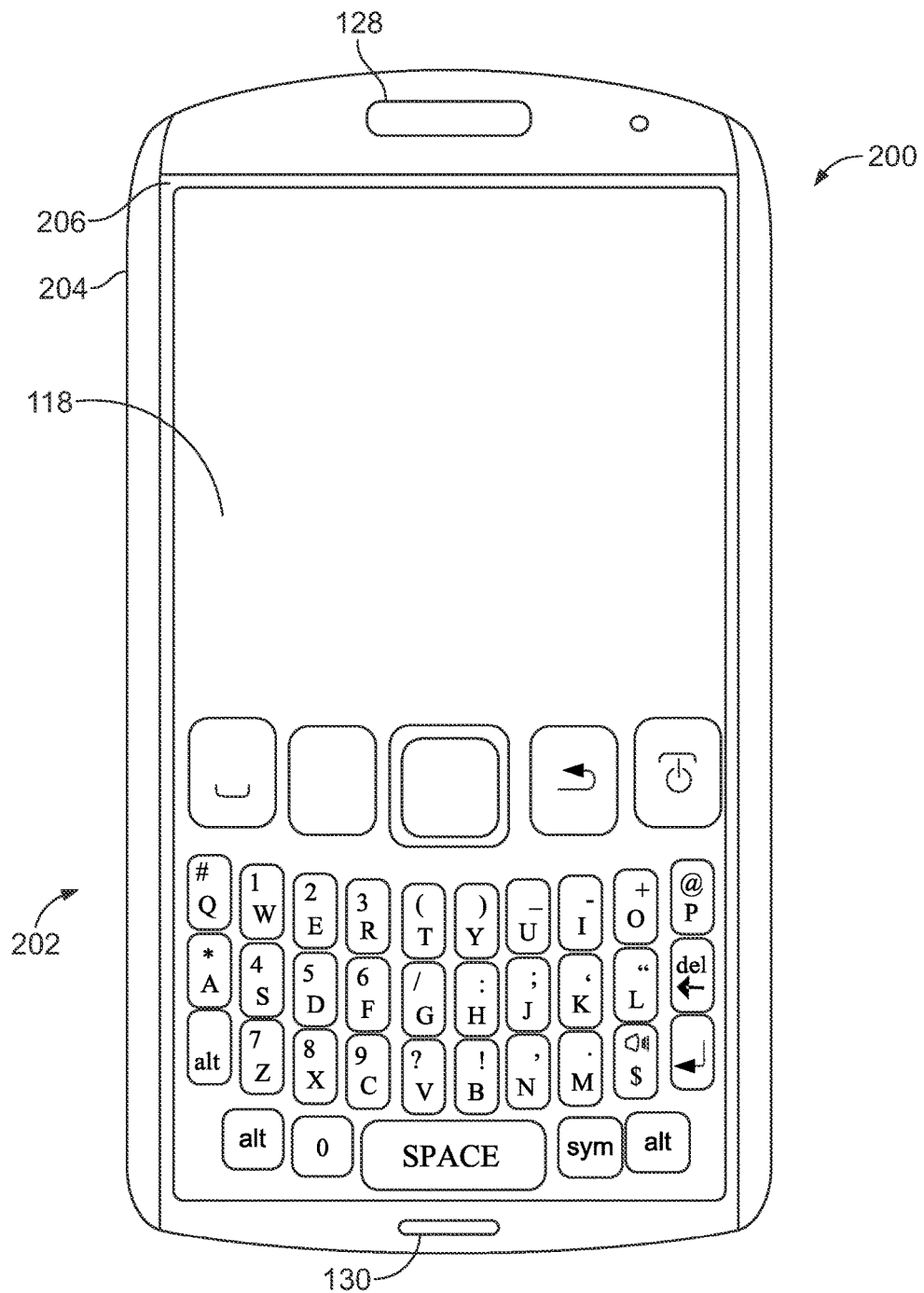
FIG. 2 is an example portable electronic device that may implement the example block diagram of FIG. 1.

FIG. 2 is a perspective view of an example portable electronic device 200 in accordance with the teachings disclosed herein. In the example of FIG. 2, the portable electric device 200 is a handheld communication device or mobile phone. The electronic device 200 may be a data and/or voice-enabled handheld device that may be used to send and receive a message, a voice communication, a textual entry, etc. The portable electronic device 200 includes a housing 202 that can be held in one hand by a user of the portable electronic device 200 during data (e.g., text) and/or voice communications.

The housing 202 encloses electronic or mobile components such as, for example, the electronic components described above in connection with FIG. 1. For example, the housing 202 may include a first housing or base 204 that couples to a second housing or lid 206 to enclose a circuit board (e.g., a PCB), the touch-sensitive display 118, the speaker 128, the microphone 130, the auxiliary I/O 124, the data port 126, etc. In the example of FIG. 2, a user interacts with the electronic device 200 via the touch-sensitive display 118 to choose commands, execute application programs, and perform other functions by selecting menu items or icons by contacting or touching the icon or image via the touch sensitive display 118.

Figure 3:
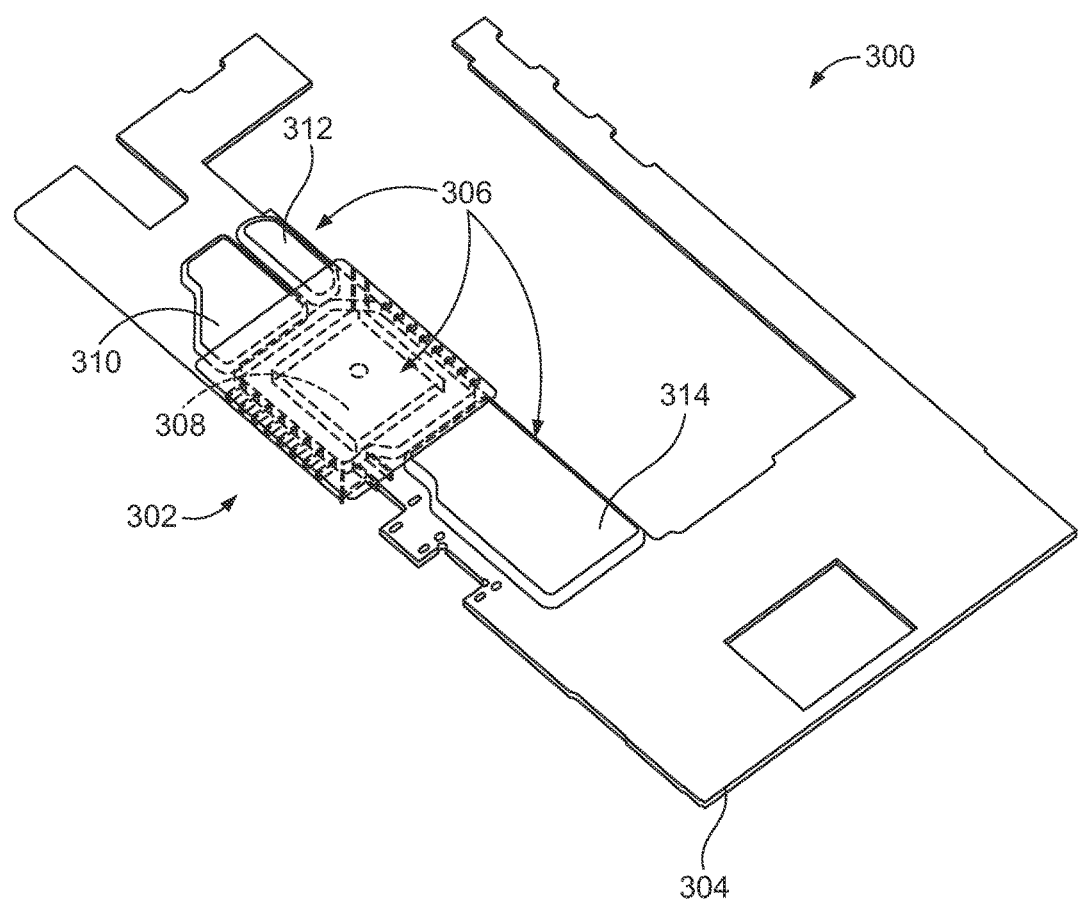
FIG. 3 is a perspective view of an example circuit board of the example electronic device of FIG. 2 having a heat dissipation assembly in accordance with the teachings disclosed herein.

FIG. 3 illustrates a perspective view of a circuit board assembly 300 positioned in the housing 202 of the example electronic device 200 of FIG. 2. The example circuit board assembly 300 includes a heat transfer or thermal dissipation assembly 302 in accordance with the teachings disclosed herein to dissipate or remove heat generated by the circuit board assembly 300 and transferring to cooler surroundings such as, for example, the housing 202 of the electronic device 200 of FIG. 2.

Referring to FIG. 3, the example circuit board assembly 300 includes a substrate or printed circuit board 304 having a plurality of electronic components 306. For example, the substrate 304 includes an integrated circuit 308 (e.g., discrete integrated circuits chip) positioned or mounted on the substrate 304. For example, the integrated circuit 308 may be surface mounted to the substrate 304. The thermal dissipation assembly 302 is coupled to the substrate 304 (e.g., via soldering) and covers or is positioned over or on top of the integrated circuit 308. Other passive and/or active electronic components such resistors, transmitters, diodes capacitors, conductive traces and/or other electronic components are also positioned or coupled (e.g., formed or soldered with) the substrate 304. Such components may be positioned adjacent to and/or surrounding the integrated circuit 308. Some such electrical components 306 may be covered by additional heat shields 310, 312 and 314. The heat shields 310-314 may be positioned adjacent the thermal dissipation assembly 302.

Figure 4:
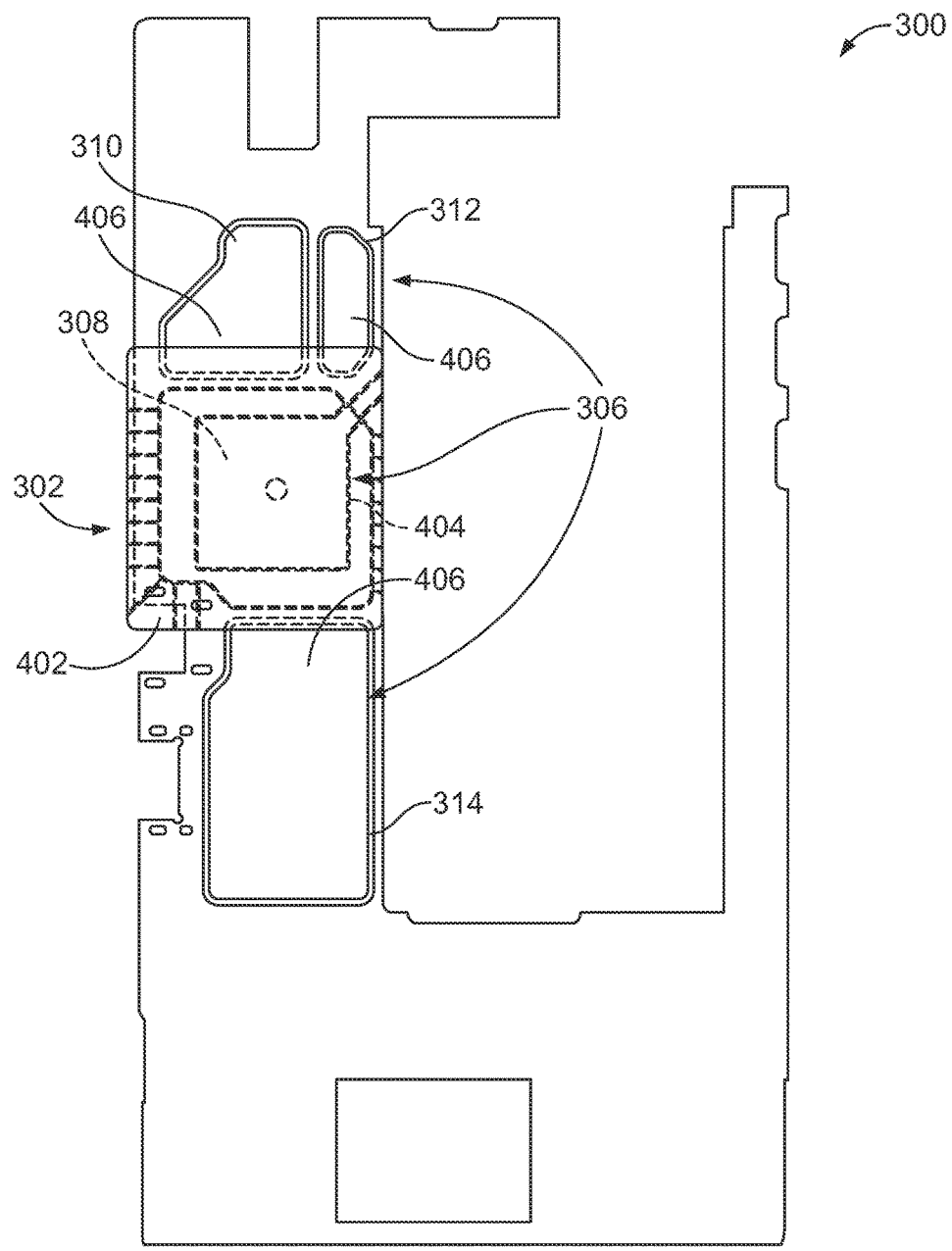
FIG. 4 is a plan view of the example circuit board of the example electronic device of FIG. 3.

FIG. 4 is a plan view of the example circuit board assembly 300 of FIG. 3. Referring to FIG. 4, the thermal dissipation assembly 302 includes a thermal dissipater shield 402 that projects beyond a perimeter 404 of the integrated circuit 308. More specifically, the thermal dissipater shield 402 includes a surface area that is substantially greater than (e.g., twice as large as) a surface area defined by the integrated circuit 308. In this manner, the thermal dissipater shield 402 can extend or project over at least a portion of the neighboring heat shields 310, 312 and/or 314. In other examples, the thermal dissipater shield 402 may extend across an entire surface of a heat sink positioned adjacent or in juxtaposition relative to the integrated circuit 308. For example, the thermal dissipater shield 402 may be positioned over an upper surface 406 of the heat shields 310-314 over which the thermal dissipater shield 402 covers or projects. The thermal dissipater shield 402 may be in direct engagement with the upper surface 406 or may be spaced away from the upper surface 406 by a relatively small gap. As shown in FIG. 4, the thermal dissipater shield 402 extends over portions of the heat shields 310-314. Such a configuration significantly increases the cooling rate of the electronic components 306. Although not shown, the thermal dissipater shield 402 may also extend over other electrical components that do no employ heat shields (e.g., electronic components not covered by a heat shield).

Figure 5:
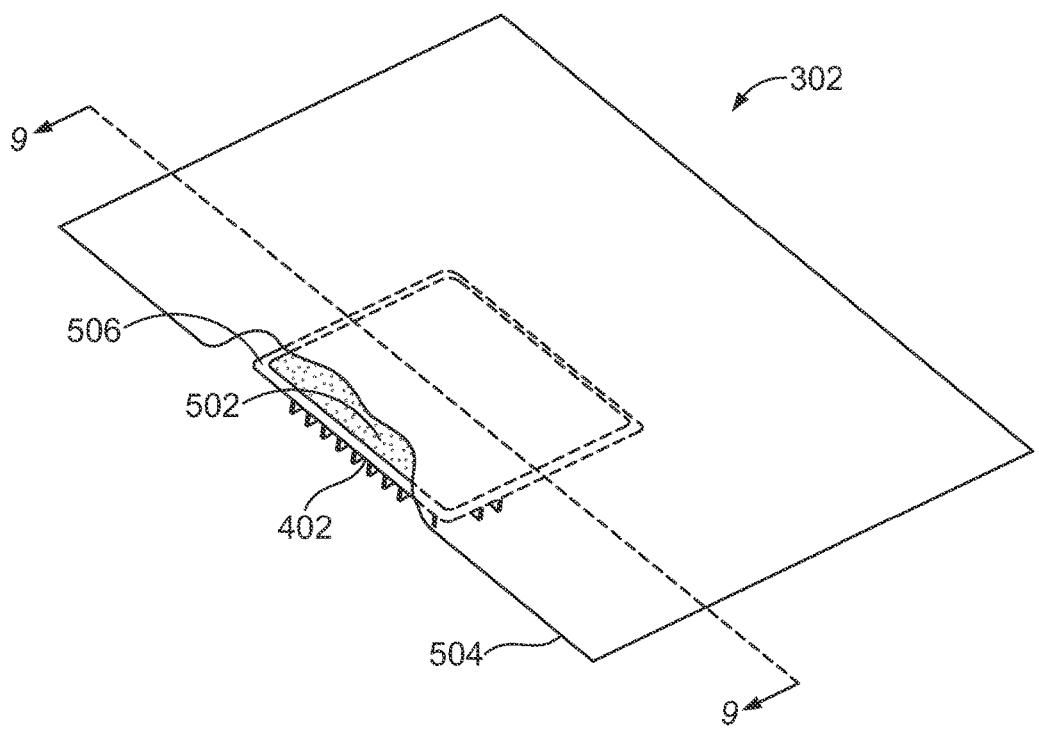
FIG. 5 is a perspective view of the example heat dissipation assembly of the example circuit board of FIGS. 3 and 4.

FIG. 5 is a perspective view of the example thermal dissipation assembly 302 of FIGS. 3 and 4. Referring to FIG. 5, the example thermal dissipation assembly 302 includes the thermal dissipater shield 402 and a thermal grease or thermal gel 502. The example thermal dissipation assembly 302 may also include a thermal spreader 504. When the thermal spreader 504 is employed, the thermal gel 502 is positioned between the thermal dissipater shield 402 and the thermal spreader 504. More specifically, the thermal gel 502 is positioned or spread across substantially an upper surface 506 of the thermal dissipater shield 402. The thermal spreader 504 of the illustrated example is plate composed of, for example, copper, aluminum and/or any material or alloy having a high thermal conductivity characteristic(s) or property. The thermal spreader 504 helps transfer, conduct or spread heat from the thermal dissipater shield 402 to cooler surroundings such as, for example, the housing 202 of the electronic device 200 of FIG. 2. In other words, the thermal spreader 504 may be employed to help move, transfer or distribute heat generated by the integrated circuit 308 and/or the other electronic components 306 of the electronic device 200 across a greater surface area. As a result, the thermal spreader 504 enables the thermal dissipater shield 402 to more rapidly and effectively dissipate or remove heat generated by the integrated circuit 308, thereby increasing a heat transfer rate of the thermal dissipation assembly 302.

Figure 6:
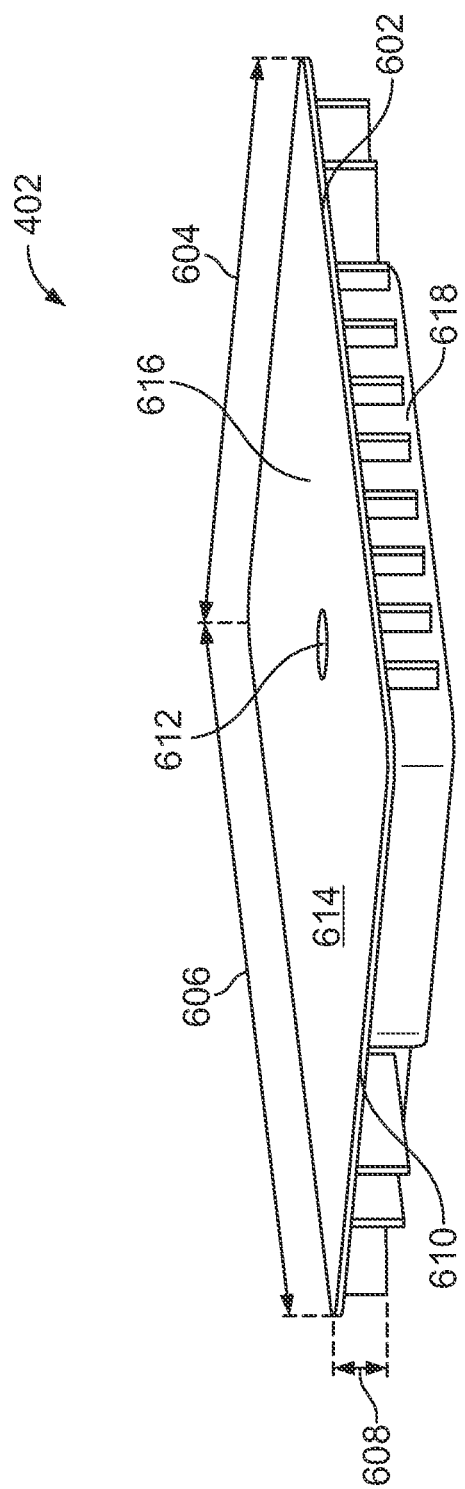
FIG. 6 is a perspective view of an example heat dissipater apparatus of the example heat dissipation assembly of FIGS. 3-5.

FIG. 6 is a perspective view of the example thermal dissipater shield 402 of FIGS. 3-5. The thermal dissipater shield 402 defines a body 602 having a dimensional width 604, a dimensional length 606 and a dimensional height 608. The body 602 defines a lateral wall 610 (e.g., an upper or substantially horizontal wall) having an opening 612. The dimensional length 606 and the dimensional width 604 of the thermal dissipater shield 402 define a surface area 614 of an outer surface 616 of the lateral wall 610. The example thermal dissipater shield 402 and/or at least a portion of a base 618 may be plated with a material or alloy to enable the thermal dissipater shield 402 to be soldered to the substrate 304.

Figure 7:
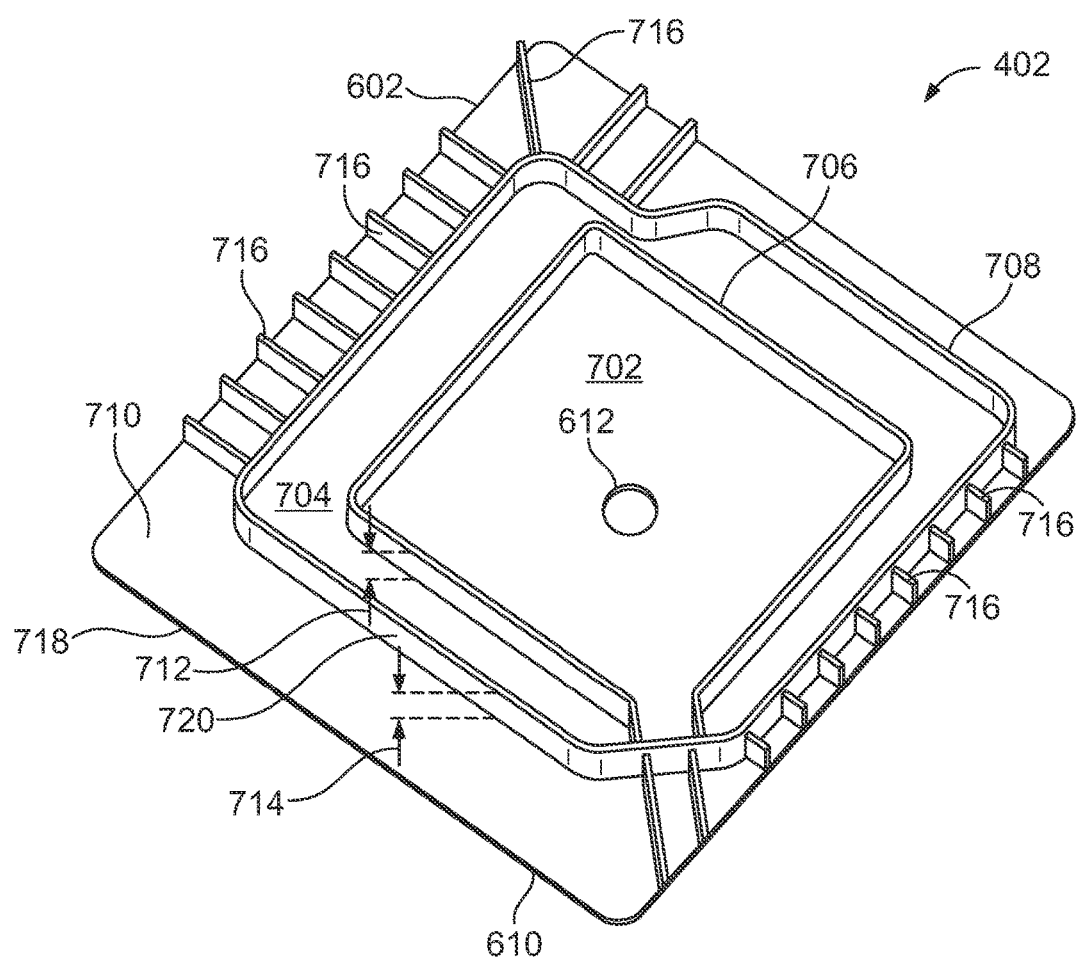
FIG. 7 is a perspective bottom view of the example heat dissipater apparatus of FIGS. 3-6.

FIG. 7 is a perspective, bottom view of the example thermal dissipater shield 402 of FIGS. 3-6. The body 602 of the thermal dissipater shield 402 defines a first cavity 702 adjacent a second cavity 704. More specifically, the first cavity 702 is isolated or separated from the second cavity 704. Further, the opening 612 of the lateral wall 610 is in fluid communication with the first cavity 702 and the opening 612 is isolated from the second cavity 704.

To define the cavities 702 and 704, the body 602 includes a plurality of side walls 706 and 708 (e.g., substantially vertical walls) projecting or extending from an inner surface 710 of a lateral wall 610. In this example, the first side wall 706 projects from the inner surface 710 of the lateral wall 610 to define the first cavity 702 and the second side wall 708 projects from the inner surface 710 of the lateral wall 610 to define the second cavity 704. In the illustrated example, the lateral wall 610 extends over the cavities 702 and 704 to define a portion of the first cavity 702 and a portion of the second cavity 704. In particular, the first side wall 706 and the lateral wall 610 define the first cavity 702 and the second side wall 708 and the lateral wall 610 define the second cavity 704.

More specifically, the first side wall 706 defines a perimeter of the first cavity 702 and isolates the first cavity 702 from the second cavity 704. Likewise, the second side wall 708 defines a perimeter of the second cavity 704 and separates the second cavity 704 from areas adjacent the second side wall 708. Thus, the first side wall 706 completely encases or surrounds the first cavity 702. Additionally, the second side wall 708 of the illustrated example completely surrounds the second cavity 704 and surrounds the first side wall 706. In other words, a perimeter of the second side wall 708 is greater than a perimeter of the first side wall 706. In the illustrated example, the first side wall 706 is substantially parallel relative to the second side wall 708, and the lateral wall 610 is substantially perpendicular relative to the side walls 706 and 708. However, in other examples, the side walls 706 and/or 708 may be non-perpendicular relative to the lateral wall 610 such that the side walls 706 and/or 708 project at an angle (e.g., less than 90 degrees) relative to the inner surface 710 of the lateral wall 610. Further, a dimensional height 712 of the first side wall 706 is substantially the same as a dimensional height 714 of the second side wall 708. However, in other examples, the dimensional height 714 of the second side wall 708 may be less than the dimensional height 712 of the first side wall 712.

The body 602 also defines a plurality of heat fins 716 positioned along or adjacent a perimeter edge 718 of the lateral wall 610 to increase a surface area of the body 602 to increase and/or provide a greater amount of heat dissipation. In this example, the heat fins 718 project or extend between an outer surface 720 of the second side wall 708 and the perimeter edge 718 of the lateral wall 610. Thus, the perimeter edge 718 of the lateral wall 610 extends past or beyond the second side wall 708.

Figure 8:
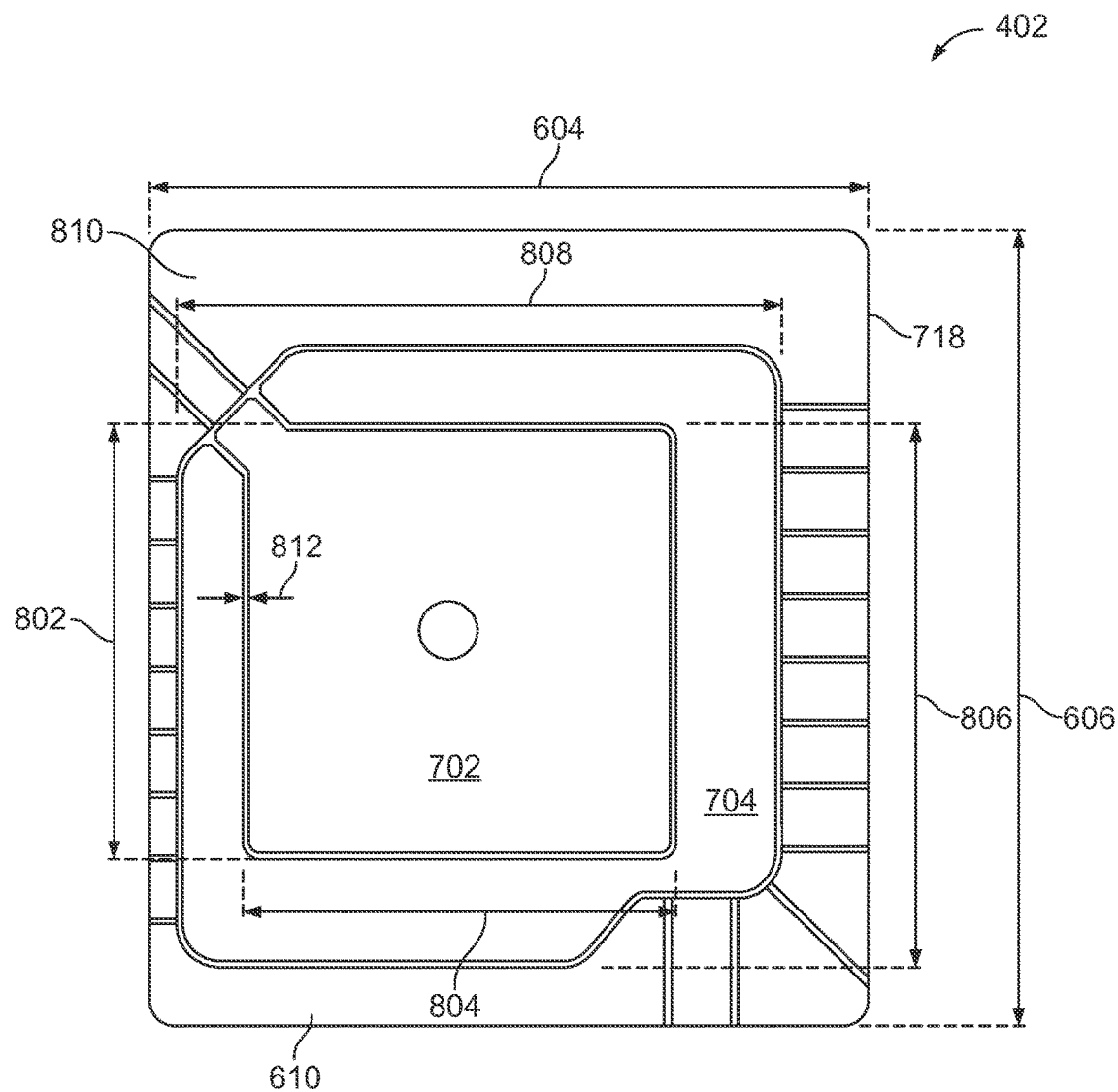
FIG. 8 is a plan view of the example heat dissipater apparatus of FIG. 7.

FIG. 8 is a plan view of the example thermal dissipater shield 402 of FIG. 7. Referring to FIG. 8, the dimensional length 606 and/or width 604 of the lateral wall 610 is greater than a dimensional length 802 and/or width 804 of the first cavity 702. Further, the dimensional length 606 and/or width 604 of the lateral wall 610 are greater than a dimensional length 806 and/or width 808 of the second cavity 704. As a result, the lateral wall 610 provides a canopy 810 that can project over neighboring electronic components 306 (FIG. 4) and/or other heat shields or heat sinks 310-314 (FIG. 4) positioned adjacent the lateral wall 610 as noted above in connection with FIG. 4. Thus, the canopy 810 significantly increases the surface area 614 of the thermal dissipater shield 402 onto which the thermal gel 502 can be applied. In particular, the thermal gel 502 may be applied or cover the surface area 614 that is greater than a surface area provided by the integrated circuit 308. For example, the thermal gel 502 can be applied in the first cavity 702 and across substantially the entire surface area 614 of the outer surface 616 of the lateral wall 610. Thus, the thermal gel 502 can help transfer heat generated by electronic components positioned in the first cavity 702, in the second cavity 704 and/or positioned within or adjacent the perimeter edge 718 of the lateral wall 610. With the addition of the thermal spreader 504, the canopy 810 significantly increases a heat transfer coefficient and/or heat transfer rate of the thermal dissipation shield 402. As a result, the integrated circuit 308 can be cooled at a relatively faster rate.

The example thermal dissipater shield 402 may be formed as a unitary piece or structure via casting, injection molding and/or any other suitable manufacturing process(es) and may be composed of magnesium, aluminum and/or any other material or alloy having a relatively high thermal conductivity characteristic or property. Further, the thermal dissipater shield 402 may have a wall thickness 812 of approximately 0.2 millimeters or less to similar to known heat shields composed of sheet metal that are folded/drawn. The thermal dissipater shield 402 may have a specific shield geometry having any suitable dimensions or profiles. In the illustrated example disclosed herein, the example thermal dissipater shield 402 employs a rectangular shape or profile. However, in other examples, the thermal dissipater shield 402, the cavities 702 and 704 and/or the lateral wall 610 may include a circular profile and/or any other suitable profile or shape. After the heat dissipater shield 402 is formed, the heat dissipater shield 402 or at least the base 618 platted with a material to enable soldering to the substrate 304. For example, the heat dissipater shield 402 may be plated or coated with (e.g., dipped in a bath of) a copper material(s) or alloy.

Figure 9:
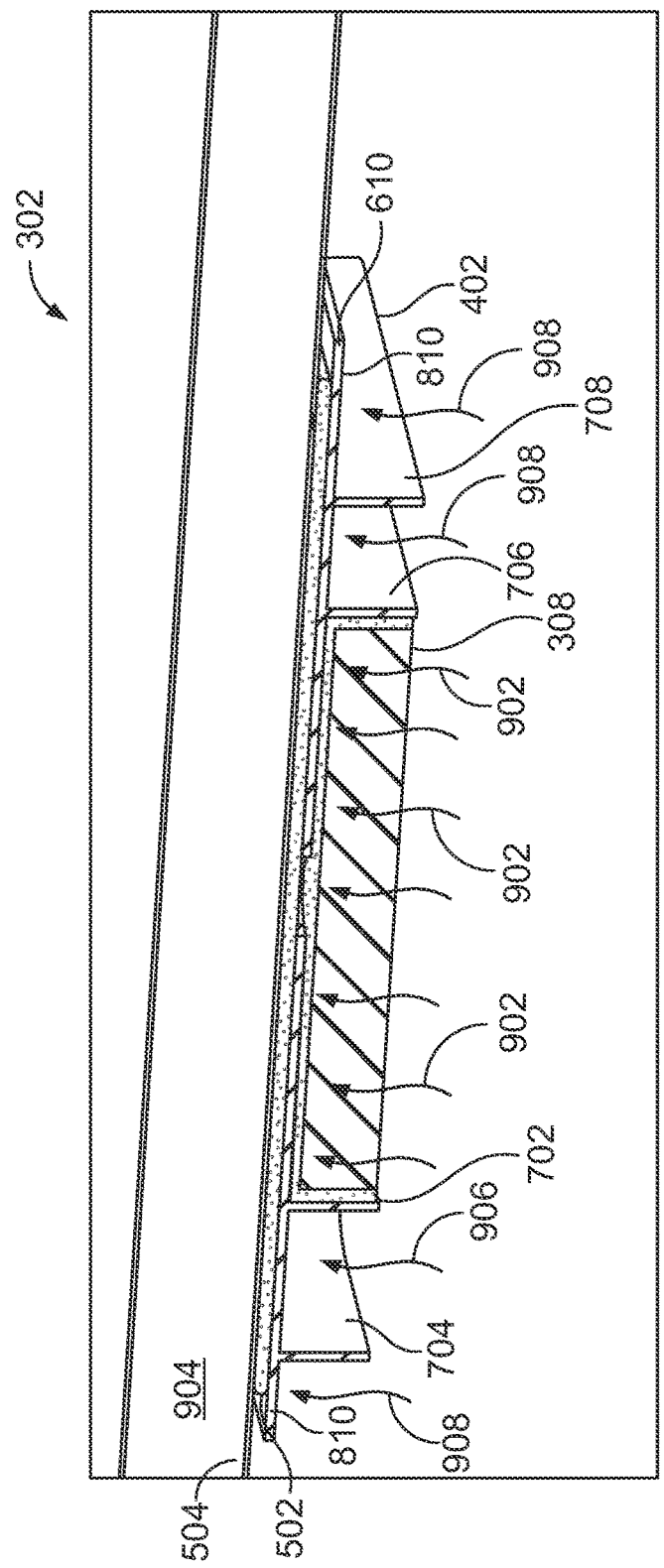
FIG. 9 is a perspective, cross-sectional view of the example heat dissipation assembly taken along line 9-9 of FIG. 5.

FIG. 9 is a cross-sectional view of the example thermal dissipation assembly 302 taken along line 6-6 of FIG. 5 shown with the integrated circuit 308 positioned in the first cavity 702. As illustrated in FIG. 9, the first side wall 706 isolates the integrated circuit 308 from discrete electronic components surrounding the integrated circuit 308 and/or that may be positioned in the second cavity 704 defined by the second side wall 708. In this manner, the thermal gel 502 can be applied to the integrated circuit 308 without contacting the discrete components surrounding the integrated circuit 308 and/or positioned in the second cavity 704. In other words, the (inner) side wall 702 captures the thermal gel 502 within the first cavity 702 and prevents or restricts the thermal gel 502 from flowing into the second cavity 704. The thermal gel 502 is provided to the first cavity 702 and the integrated circuit 308 via the opening 612 of the lateral wall 610.

FIG. 9 illustrates heat 900 generated by the integrated circuit 308 being dissipated via the thermal dissipater shield 402. The lateral wall 610 can spread or distribute heat 902 generated by the integrated circuit 308 across the surface area 614 that is greater than the surface area of the integrated circuit 308. Additionally, because the thermal gel 502 can be applied across substantially the entire surface area 614 of the lateral wall 610, the thermal dissipater shield 402 dissipates a greater amount of heat 902. Further, the thermal spreader 504 spreads or distributes the heat 902 dissipated by the thermal dissipater shield 402 across a surface area 904 of the thermal spreader 504 (e.g., defined by a dimensional length and width of the thermal spreader 504) that is substantially greater than the surface area 614 of the lateral wall 610, thereby significantly increasing cooling efficiency and/or a heat transfer rate of the thermal dissipater shield 402. Additionally, because the lateral wall 610 or the canopy 810 overhangs or covers other electronic components 306 and/or heat shields 310-314, the lateral wall 610 of the thermal dissipater shield 402 can help dissipate heat generated by those other electronic components 306 and/or heat shields 310-314. For example, heat 906 generated by discrete electronic components positioned in the second cavity 704 can be dissipated or removed to the thermal spreader 504 via the lateral wall 610. Additionally, heat 908 generated by electronic components or heat shields 310-314 covered by the canopy 810 can also be dissipated to the thermal spreader 504 via the lateral wall 610. Additionally or alternatively, the thermal spreader 504 and/or the thermal dissipater shield 402 significantly reduce and/or eliminate localized hot spots or zones on a surface of the housing 202 by dissipating the heat generated by the electronic components 306 across the respective surface areas 904 and 614.

Figure 10:
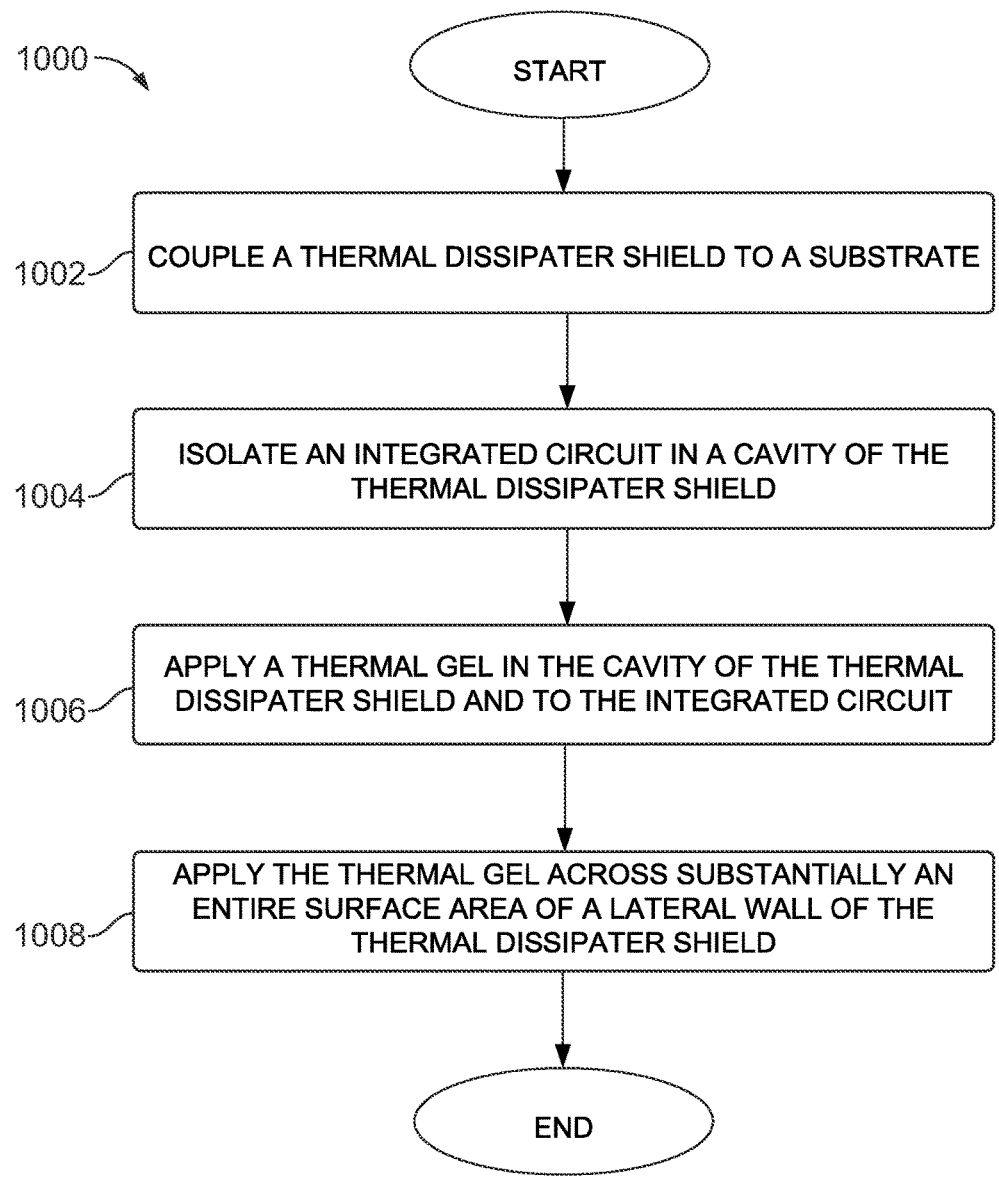
FIG. 10 depicts a flowchart of an example method to assemble an example thermal dissipation assembly in accordance with the teachings disclosed herein.

FIG. 10 is a flowchart of an example method 1000 that may be used to assemble an example thermal dissipation assembly disclosed herein such as the example thermal dissipation assembly 302 of FIGS. 3-9. While the example method 1000 may be used to assemble an example fuel system herein, one or more of the blocks illustrated in FIG. 10 may be combined, divided, re-arranged, omitted, eliminated and/or implemented in any other way. Further still, the example method of FIG. 10 may include one or more blocks in addition to, or instead of, those illustrated in FIG. 10, and/or may include more than one of any or all of the illustrated blocks. Although the example method 1000 is described with reference to the flowchart illustrated in FIG. 10, many other methods of assembling an example thermal dissipation assembly may alternatively be used.

The example method of assembling an example thermal dissipation assembly disclosed herein is discussed in connection with the example thermal dissipation assembly 302 of FIGS. 2-9. To assemble the example thermal dissipation assembly 300 disclosed herein, the thermal dissipater shield 402 is coupled to the substrate 304. (block 1002). For example, the thermal dissipation shield 402 may be coupled to the substrate 304 via, for example, welding. In particular, the thermal dissipater shield 402 may be plated with a material to enable welding to the substrate 304.

The integrated circuit 308 is positioned inside the first cavity 702 when the thermal dissipater shield 402 is coupled to the substrate 304. (block 1004). In this manner, the first cavity 702 isolates the integrated circuit 308 from the second cavity 704 and/or discrete electronic components surrounding the integrated circuit 308. Further, in some examples, the canopy 810 of the lateral wall 610 may be positioned over adjacent or neighboring electronic components and/or other heat sinks positioned on the substrate 304 to facilitate or help transfer heat from those other electronic components and/or heat sinks.

When coupled to the substrate 304, the thermal gel 502 may be applied in the first cavity 702 (block 1006). For example, the thermal gel 502 may be applied to first cavity 702 via the opening 612 in the lateral wall 610. As a result, the thermal gel 502 is applied to all surfaces (e.g., a top surface and all side surfaces) of the integrated circuit 308 that are exposed or in communication with the first cavity 702. Further, the first side wall 702 prevents the thermal gel 502 from flowing out of the first cavity 702 and into, for example, the second cavity 704.

The thermal gel 502 is then applied across substantially the entire surface area 614 of the outer surface 616 of the lateral wall 610. (block 1008). In some examples, the thermal spreader 504 may be positioned on the lateral wall 610 to capture the thermal gel 502 between the thermal spreader 504 and the lateral wall 610.

The example thermal dissipation assemblies disclosed herein significantly improve heat dissipation from electronic components positioned on a circuit board of an electronic device and maintain temperatures of electronic components significantly below maximum operating temperatures. More specifically, the example thermal dissipater shield disclosed herein enable a thermal gel to be applied to substantially an entire surface area of an integrated circuit (e.g., an IC chip) positioned on a circuit board. Additionally, the example thermal dissipater shield disclosed herein captures the integrated circuit in a cavity and isolates the integrated circuit from neighboring electronic components of the circuit board. As a result, the thermal dissipater shield significantly restricts or prevents the thermal gel from flowing to discrete electronic components of the integrated circuit that may be surrounding the integrated circuit. Thus, a greater amount of thermal gel may be applied to the integrated circuit without having the thermal gel flow onto discrete electronic components of the integrated circuit. For example, the thermal gel may be applied to approximately between 65% and 100% of a surface area of the integrated chip. In some examples, less than 65% of the surface of the integrated chip may be covered with thermal gel.

Additionally or alternatively, the example thermal dissipater shield disclosed herein provides a canopy or lateral wall that extends beyond a perimeter or dimensional profile of the integrated circuit such that the lateral wall can extend over and/or engage neighboring or adjacent electronic components adjacent the integrated circuit. Further, the thermal gel may also be applied to the lateral wall that extends over the adjacent electronic components to help dissipate heat generated by the neighboring electronic components as well as dissipate heat generated by the integrated circuit. Thus, the canopy and/or the lateral wall accelerate cooling of the integrated circuit and/or the electronic components of the circuit board.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:
1. An assembly comprising:
a thermal dissipater shield having:
  a body including a lateral wall;
  a first wall, the first wall and the lateral wall at least partially defining a first cavity;
  a second wall, the second wall and the lateral wall at least partially defining a second cavity, the second cavity being separated from the first cavity, the second wall encompassing or surrounding the first wall;
  an opening in the body to enable access to the first cavity, wherein the opening is defined substantially at a center of a portion of the lateral wall that defines the first cavity together with the first wall; and
  a plurality of heat fins that are perpendicular to and extend from an outer surface of the second wall, the plurality of fins also being perpendicular to and extend from an inner surface of the lateral wall, and the plurality of heat fins spaced apart from each other and positioned along a portion of a perimeter edge of the lateral wall;

a thermal spreader, wherein the thermal spreader is a plate without fins, the plate is positioned on the lateral wall, and a surface area of the plate is substantially larger than a surface area of the lateral wall; and a thermal gel, wherein the thermal gel is applied in the first cavity, and the thermal gel is also applied across substantially an entire surface area of the lateral wall, and is applied between the thermal spreader and the lateral wall.

2. The assembly of claim 1, wherein the first wall projects away from the lateral wall.

3. The assembly of claim 2, wherein the second wall projects away from the lateral wall.

4. The assembly of claim 3, wherein the first wall is substantially parallel to the second wall, and wherein the first and second walls are substantially perpendicular relative to the lateral wall.

5. The assembly of claim 4, wherein a perimeter edge of the lateral wall extends beyond the second wall.

6. The assembly of claim 1, wherein the opening is isolated from the second cavity.

7. The assembly of claim 1, wherein the plurality of heat fins are exactly perpendicular to and extending from an outer surface of the second wall.

8. The assembly of claim 1, wherein the plurality of heat fins are exactly perpendicular to the lateral wall.

9. The assembly of claim 1, wherein the heat fins extend between the outer surface of the second wall and a perimeter edge of the lateral wall.

10. The assembly of claim 1, wherein a perimeter of the second wall is greater than a perimeter of the first wall.

11. The assembly of claim 1, wherein a dimensional length and width of the lateral wall is greater than a dimensional length and width defined by the first cavity.

12. The assembly of claim 1, wherein a dimensional length and width of the lateral wall is greater than a dimensional length and width defined by the second cavity.

13. The assembly of claim 1, wherein a dimensional height of the first wall is substantially the same as a dimensional height of the second wall.

* * * * *